United States Patent
Yao et al.

(10) Patent No.: US 11,875,807 B2
(45) Date of Patent: Jan. 16, 2024

(54) DEEP LEARNING-BASED AUDIO EQUALIZATION

(71) Applicant: Anker Innovations Technology Co., Ltd., Changsha (CN)

(72) Inventors: Qingshan Yao, Shenzhen (CN); Yu Qin, Shenzhen (CN); Haowen Yu, Shenzhen (CN); Feng Lu, Shenzhen (CN)

(73) Assignee: Anker Innovations Technology Co., Ltd., Changsha (CN)

( * ) Notice: Subject to any disclaimer, the term of this patent is extended or adjusted under 35 U.S.C. 154(b) by 371 days.

(21) Appl. No.: 17/059,179

(22) PCT Filed: Jun. 3, 2019

(86) PCT No.: PCT/CN2019/089757
§ 371 (c)(1),
(2) Date: Nov. 25, 2020

(87) PCT Pub. No.: WO2019/233360
PCT Pub. Date: Dec. 12, 2019

(65) Prior Publication Data
US 2021/0217430 A1 Jul. 15, 2021

(30) Foreign Application Priority Data
Jun. 5, 2018 (CN) .......................... 201810583138.7

(51) Int. Cl.
*G10L 21/007* (2013.01)
*G06N 3/088* (2023.01)
(Continued)

(52) U.S. Cl.
CPC ............ *G10L 21/007* (2013.01); *G06N 3/088* (2013.01); *G10L 25/30* (2013.01); *G10L 25/51* (2013.01)

(58) Field of Classification Search
CPC ....... G10L 21/007; G10L 25/30; G10L 25/51; G10L 21/0316; G06N 3/088;
(Continued)

(56) References Cited

U.S. PATENT DOCUMENTS 10,365,889 B2 * 7/2019 Plagge ................... G10L 15/30
11,199,853 B1 * 12/2021 Afrouzi ................ G05D 1/0246
(Continued)

FOREIGN PATENT DOCUMENTS

CN 103037100 A 4/2013
CN 106027809 A 10/2016
(Continued)

OTHER PUBLICATIONS

Aug. 31, 2020 (CN) Office Action—App. 20180583138.7.
(Continued)

*Primary Examiner* — Michael N Opsasnick
(74) *Attorney, Agent, or Firm* — Banner & Witcoff, Ltd.

(57) ABSTRACT

A deep learning method-based tonal balancing method, apparatus, and system, the method includes: extracting features from audio data to obtain audio data features, generating audio balancing results by using a trained audio balancing model based on the obtained audio data features. The present invention employs deep neural networks and unsupervised deep learning method to solve the problems of audio balancing of unlabeled music and music of unknown style. The present invention also combines user preferences statistics to achieve a more rational multi-style audio balancing design to meet individual needs.

19 Claims, 9 Drawing Sheets

(51) Int. Cl.
*G10L 25/30* (2013.01)
*G10L 25/51* (2013.01)

(58) Field of Classification Search
CPC ...... G06N 3/0445; G06N 3/0472; G10H 1/12; G10H 1/46; G10H 2210/036; G10H 2240/105; G10H 2250/311; H03G 5/005; H03G 5/165; H04R 3/04
See application file for complete search history.

(56) References Cited

U.S. PATENT DOCUMENTS

| | | | |
|---|---|---|---|
| 11,462,237 B2* | 10/2022 | Yao | G10L 25/30 |
| 2016/0125869 A1 | 5/2016 | Kulavik et al. | |
| 2016/0320840 A1* | 11/2016 | Hwang | H04R 1/1041 |
| 2017/0070817 A1* | 3/2017 | Seo | H03G 3/32 |
| 2017/0140260 A1* | 5/2017 | Manning | G06N 3/045 |
| 2018/0276540 A1* | 9/2018 | Xing | G06N 3/084 |
| 2019/0018644 A1* | 1/2019 | Kovacevic | G06F 3/0482 |
| 2019/0196777 A1* | 6/2019 | Kovacevic | G06F 3/165 |
| 2019/0310707 A1* | 10/2019 | Hwang | G06F 3/165 |
| 2020/0114931 A1* | 4/2020 | Rao et al. | G10L 15/26 |
| 2021/0158148 A1* | 5/2021 | Coover | G06N 3/08 |
| 2021/0217430 A1* | 7/2021 | Yao | G06N 3/0472 |
| 2021/0264938 A1* | 8/2021 | Yao | G10L 21/007 |
| 2021/0357580 A1* | 11/2021 | Silano | G06F 3/04817 |

FOREIGN PATENT DOCUMENTS

| | | |
|---|---|---|
| CN | 106528035 A | 3/2017 |
| CN | 107147792 A | 9/2017 |
| CN | 107886943 A | 4/2018 |
| CN | 109147807 A | 1/2019 |
| JP | 06244747 A | 9/1994 |
| JP | 2009508156 A | 2/2009 |
| JP | 201493577 A | 5/2014 |
| JP | 201754121 A | 3/2017 |

OTHER PUBLICATIONS

Mar. 3, 2020 (CN) Office Action—App. 201810583138.7.
Nov. 16, 2020 (CN) Office Action—App. 201810583138.7.
May 17, 2022 (JP) Notice of Reasons for Refusal—App. 2020-567945.
Mar. 1, 2022 (JP) Notice of Reasons for Refusal—App. 2020-567945.
Aug. 28, 2019 (WO) International Search Report—App. PCT/CN2019/089757.

* cited by examiner

Features of Wo de zu guo = [1.2, 3.7, 3.1]

DEEP LEARNING-BASED AUDIO EQUALIZATION

CROSS REFERENCE TO RELATED APPLICATION

This application is a national stage application, filed under 35 U.S.C. § 371, of International Application No. PCT/CN2019/089757, filed on Jun. 3, 2019, which claims priority to Chinese Application No. 2018105831387, filed on Jun. 5, 2018. The entire disclosures of each of the above applications are incorporated herein by reference.

BACKGROUND OF INVENTION

Field of Invention

The present invention relates to the field of sound technology, and more specifically to a deep learning method based audio balancing method, apparatus, and system for adjusting sound quality.

Description of Prior Art

Sound quality is a subjective evaluation of audio quality, everyone has different preferences for sound quality, such as preferences for different frequency bands of sound, some people like surging bass music, some people like high-frequency or even spiky sound, while others prefer clear vocals in the mid-frequency band.

Whether it is an audio playback device provider or an audio portal platform, finding ways to enhance sound quality is one of the most direct ways that can enhance the user's music experience. Sound balancing is a process of enhancing or attenuating the spectrum of frequencies within the human ear's perceptible sound frequency range, such as the high, medium and low frequency regions of the spectrum, to meet the preferences of people in different frequency bands. A common adjustment method is to set an EQ (Equalizer) curve, where each point of the EQ curve represents an enhancement or attenuation multiplier of a frequency point or frequency band, and some playback terminals and playback software provide a function to improve sound quality by adjusting parameters of an EQ equalizer of the playback terminal. At present, there are two ways to adjust the EQ equalizer, one is to adjust by user himself, such as the user manually selects the settings based on a series of given EQ. This method can not achieve an adaptive music quality adjustment for music characteristics or user preferences. Another method is to analyze the characteristics of the music's title, author, and other tags to align the user's preferences with a particular style or styles, and use an existing EQ settings to make recommendations to users.

However, if a music cannot obtain a corresponding label, a music style may belong to several categories, there are passages in the music with different styles, or the user's music list belongs to a style that we do not know, the EQ equalizer will not able to be set. Therefore, the EQ equalizer adjustments in the prior art depend on the corresponding music tags, and it cannot meet individual needs.

SUMMARY OF INVENTION

The present invention is proposed to solve the above problems by providing a deep learning method based audio balancing method, apparatus, system and computer storage medium. The present invention employs deep neural networks and unsupervised deep learning method to solve the problems of audio balancing of unlabeled music and music of unknown style. The present invention also combines user preferences statistics to achieve a more rational multi-style audio balancing design to meet individual needs.

According to an aspect of the present invention, a deep learning method based audio balancing method is provided, and the method comprises: extracting features from audio data to obtain audio data features; generating audio balancing results by using a trained audio balancing model based on the obtained audio data features.

Illustratively, the audio balancing model comprises an audio balancing model obtained by using a supervised deep learning method to evaluate styles of user preference music based on an audio database and a user preference music list.

Illustratively, the audio balancing model comprises an audio balancing model obtained by using an unsupervised deep learning method to analysis features of user preference music, the features are extracted based on the user preference music list.

Illustratively, a method of training the audio balancing model comprises:
 extracting style label features and audio data features based on an audio database;
 using the audio data features of the audio database as input layer data and using the style label features as output layer data to train to obtain the audio balancing model;
 extracting features of user preference audio data to obtain preference data features, using the preference data features as input data of the audio balancing model to obtain style label features of the user preference audio data;
 reverting the style label features of the user preference audio data to style labels of the user preference audio data to form a user preference style portrait;
 obtaining the audio balancing results by fusing the user preference style portrait and audio balancing parameters of corresponding style.

Wherein the corresponding class of tonal balance parameters are parameters of the prior art that reflect the sound quality characteristics of different styles of audio characteristics, including and not limited to the parameters of the EQ equalizer.

Illustratively, the user preference style portrait reflects user preference level for each style of audio data, comprising a proportion or a weight of each style of audio data.

Illustratively, the method of training the audio balancing model comprises:
 using user preference audio of the audio database as a training dataset, performing feature extraction to obtain audio data features of the audio database;
 training a restricted Boltzmann machine (RBM) with the audio data features as visual layer inputs;
 obtaining hidden layer features by inputting the audio data features of the training dataset into the visual layer of the RBM based on the trained RBM;
 obtaining average hidden features by classifying the hidden layer features by inputting them into a clustering model that has been trained to generate average hidden layer features;
 obtaining an average audio data feature of the audio database by performing an inverse computation based on the average hidden layer features and the RBM;

training a user preference RBM by extracting features of audios in the user preference music list and using the extracted user preference audio data features as visual layer input.

Illustratively, a method of generating the audio balancing results comprises:

obtaining user preference hidden layer features by inputting the user preference music features into the RBM visual layer based on the trained user preference RBM;

generating user preference average hidden layer features by classifying the user preference hidden layer features using the clustering model;

obtaining user preference average audio data features by performing an inverse computation based on the user preference average hidden layer features and the user preference RBM;

obtaining the audio balancing results based on the user preference average audio data features and average audio data features of the audio database.

Illustratively, the method of generating the audio balancing results further comprises:

obtaining final audio balancing results by comparing the user preference average audio data features with the average audio data features of the audio database and enhancing or attenuating the audio balancing based on the deviation trend thereof.

Illustratively, a method of extracting audio data features comprises performing feature extraction after framing the audio data.

Illustratively, the audio data features comprises time domain features or frequency domain features.

Illustratively, the trained audio balancing model comprises an online audio balancing model and/or an offline audio balancing model.

According to another aspect of the present invention, a deep learning method based audio balancing apparatus is provided, which comprises a feature extraction module and an audio balancing module.

The feature extraction module is configured to acquire audio and perform feature extraction to obtain audio data features.

The audio balancing module is configured to generate audio balancing results based on the audio data features extracted by the feature extraction module and the trained audio balancing model.

Illustratively, the audio balancing module further comprises an online audio balancing module and/or an offline audio balancing module.

The online audio balancing module is configured to obtain an online audio balancing model by using a supervised deep learning method method to evaluate real time user preference music based on the audio database and the user preference music list, the online audio balancing module is further configured to obtain an online audio balancing results by combining an music style equalizer.

The offline audio balancing module is configured to extract features of the user preference music based on the user preference music list and obtain an offline audio balancing model using an unsupervised deep learning method method, the offline audio balancing module is further configured to generate offline audio balancing results for the user.

According to another aspect of the present invention, a deep learning method based audio balancing system is provided, which comprises a memory and a processor, wherein the memory is configured to store computer programs running by the processor, and the processor is configured to perform the deep learning method based audio balancing method of the present invention by running the computer program.

BRIEF DESCRIPTION OF DRAWINGS

The above and other objects, features and advantages of the present invention will become more apparent with the detailed description of the present embodiments in conjunction with the accompanying drawings. The drawings are used to provide a further understanding of the embodiments and form part of the specification. The drawings are also used in conjunction with the embodiments to explain the invention and do not constitute a limitation of the invention. In the drawings, same reference number typically represents same component or step.

DETAILED DESCRIPTION OF PREFERRED EMBODIMENTS

In order to make the objects, technical solutions, and advantages of the present invention more apparent, illustrative embodiments according to the present invention will be described in detail below with reference to the accompanying drawings. Obviously, the embodiments are only partial examples of the present invention, and not all embodiments of the present invention. It should be understood that the present invention is not limited by the embodiments described herein.

Figure 1:
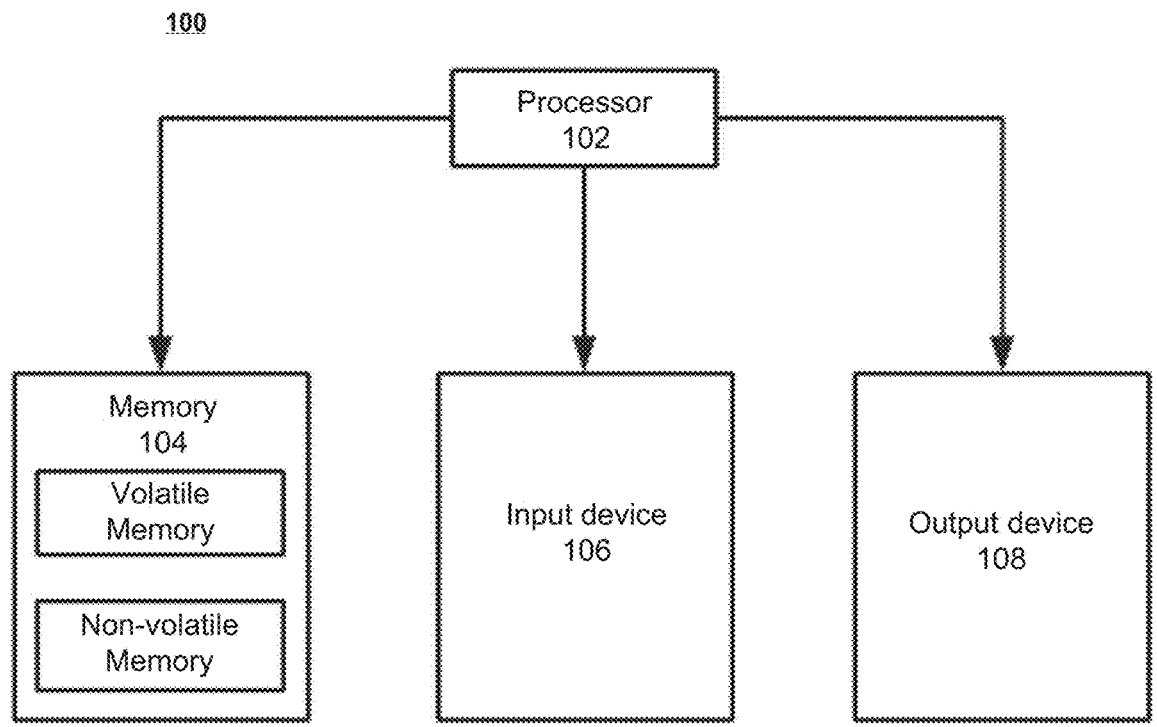
FIG. 1 is a schematic diagram of an electronic device for implementing a deep learning method based audio balancing method, apparatus, system, memory, and computer program according to embodiments of the present invention.

First, with reference to FIG. 1, an electronic device 100 for implementing a deep learning method based tonal balance method, apparatus, system, memory, and computer program of this embodiment is described.

As shown in FIG. 1, the electronic device 100 includes one or more processors 102, one or more memories 104, an input device 106, and an output device 108. The components are interconnected via a bus system 110 and/or other connection mechanisms (not shown). It should be noted that the components and structures of the electronic device 100 shown in FIG. 1 are exemplary, not limiting, and that the electronic device may also have other components and structures as needed.

The processor 102 can be a central processing unit (CPU) or other processing unit with data processing capability and/or instruction execution capability, and could control other components of the electronic device 100 to perform the desired function.

The memory 104 includes one or more computer program products, which include various computer-readable storage media, such as volatile memory and/or non-volatile memory. The volatile memory includes, for example, random access memory (RAM) and/or cache memory. The non-volatile memory includes, for example, a read-only memory (ROM), a hard disk, a flash memory, and the like. One or more computer program instructions can be stored on the computer-readable storage medium, and the processor 102 can run the program instructions to implement the client functionality (as implemented by the processor) and/or other desired functionality of the embodiments described below. Various applications and various data, such as various data used and/or generated by the applications can be stored on the computer-readable storage medium.

The input device 106 can be a device for inputting instructions, and includes one or more of a keyboard, a mouse, a microphone, and a touch screen, etc.

The output device 108 outputs various information (e.g., images or sounds) to an external source (e.g., a user) and includes one or more of a display, a speaker, and the like.

Exemplary electronic devices for implementing deep learning method based audio sound quality enhancement methods, devices, systems, storage media, and computer programs in accordance with embodiments of the present invention could include terminals such as smartphones, tablets, and the like.

According to one aspect of the present invention, a deep learning method based audio balancing method is provided, the method comprising:
extracting features from audio data to obtain audio data features;
generating audio balancing results by using a trained audio balancing model based on the obtained audio data features.

Wherein the audio balancing includes and is not limited to Equalizer (EQ) adjustment.

Referring to FIG. 2 to FIG. 12, taking music EQ adjustment as an example, a deep learning method based audio balancing method is described according to the embodiments of the present invention.

Figure 2:
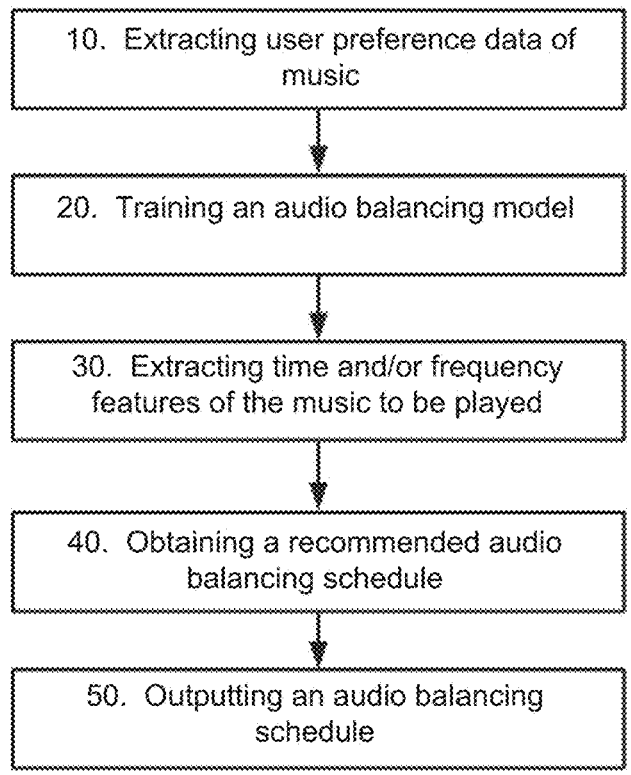
FIG. 2 is a schematic flowchart for implementing an audio balancing method according to embodiments of the present invention.

As shown in FIG. 2, the deep learning method based audio balancing method comprises the following steps.

Extracting user preferences data of music (10).

Using deep learning method to train a user's audio balancing model (20).

Extracting the time and/or frequency domain features of the music to be played (30).

Calculating the recommended audio balancing scheme for the music to be played using the user's audio balancing model developed by deep learning method (40).

Outputting the audio balancing scheme to adjust the sound of the music to be played (50).

Wherein, the user preference data includes, but is not limited to, a user's music play list, behavior, and the like. Extracting time and/or frequency domain features of the music to be played includes and is not limited to extracting features after framing of the music to be played.

Figure 3:
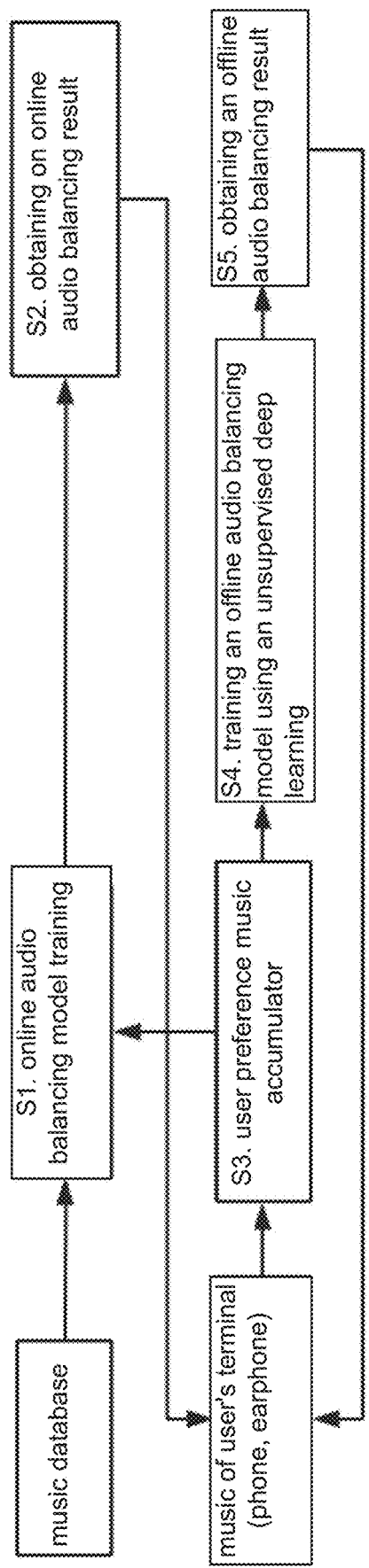
FIG. 3 is a schematic diagram of a deep learning method based audio balancing method according to embodiments of the present invention.

Further, as shown in FIG. 3, the deep learning method based audio balancing method include the following steps.

Obtaining an online audio balancing model by using a supervised deep learning method to evaluate styles of user preference music based on an audio database and a user preference music list (S1), and combined with an equalizer for the corresponding musical style to obtain the user's online tonal equalization results (S2).

Or obtaining an offline audio balancing model by using an unsupervised deep learning method to analysis features of user preference music, the features are extracted based on the user preference music list (S4), and generating the user's offline tonal equalization results (S5).

The list of user preference music is provided by a user preference music accumulator (S3).

Wherein S1 and S2 are collectively called "Online style fusion audio EQ design system", and S4 and S5 are collectively called "Offline personalized audio EQ design system". The former one needs to use online user labeling of music style when training, so it is called "online style fusion audio EQ design system". The latter one does not require online user labeling for training, only needs the music waveform of the music, thus is called "offline personalized audio EQ design system".

The EQ for the corresponding style of music referred to is the parameters of an audio equalizer in the prior art that reflects the characteristics of different musical styles.

Further, the user preference music accumulator obtains a user preference music list by analyzing user behaviors. The method of forming the user preference music list comprises the steps of: obtaining a user preference music and evaluating a user preference value for each music (e.g., accumulating user feedback on a music, including and not limited to the number of times the music has been played, the number of compliments, etc.; positive feedback such as playing, complimenting increases the weight value of the music, and opposite behaviors will cause a negative change in the weight value value); and then forming a user preference music list which listing the music that have interaction with the user and their weights.

Figure 4:
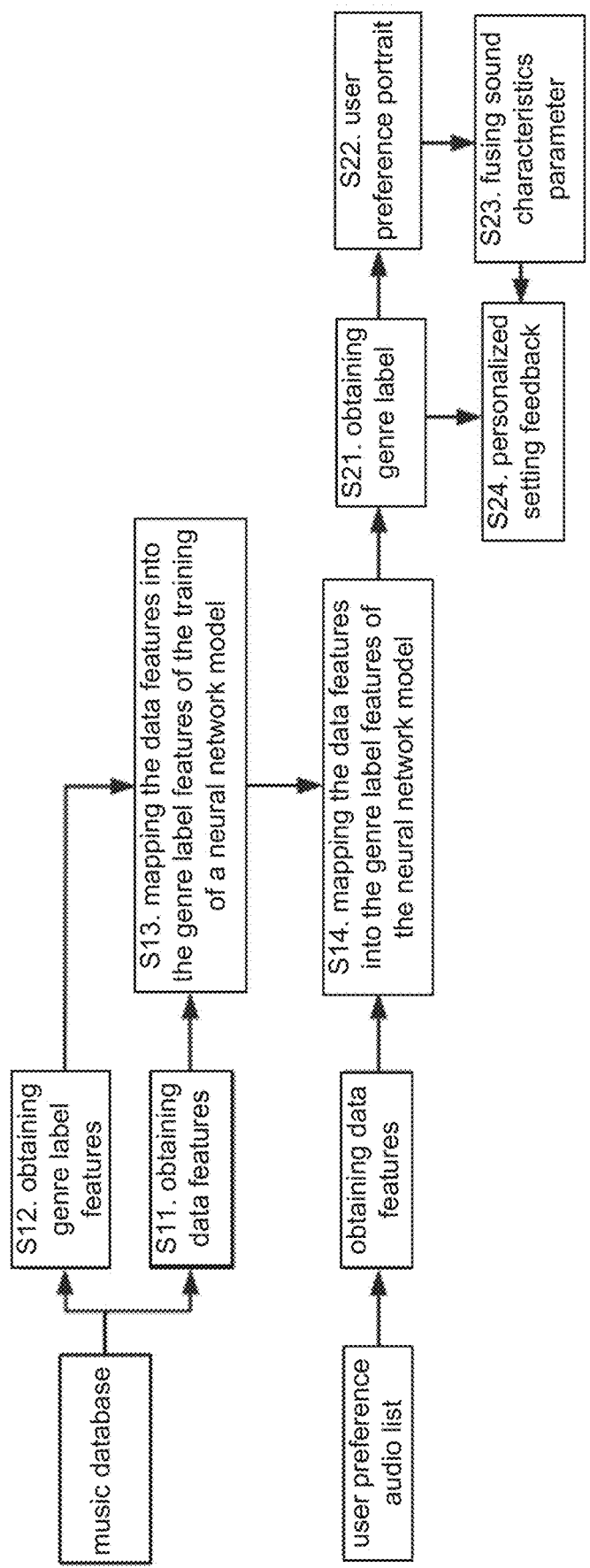
FIG. 4 is a schematic diagram of a user preference accumulator according to the embodiments of the present invention.

In an embodiment, as shown in FIG. 4, an interaction statistics matrix 300 is formed based on the number of times the user has interacted with the music in the database, the preference values including and not limited to deleting the music, playing the music, downloading the music, and other user actions.

The described interaction statistics matrix 300 was analyzed to calculate the user preference for each music based on the number of behaviors and the scores of the behaviors (301). The different behaviors reflect the different preference tendencies of the user for a piece of music, with positive behaviors, such as playing and downloading, being considered positive tendencies and receiving positive scores, and deleting such behaviors being considered negative tendencies and receiving negative scores. The score of the behavior is the weight of the number of behaviors, traversing all the number of times the user acts on a piece of music, the weighted sum of the result 302 can be seen as the user preference for music, that is, the user preference music list.

The audio data in the audio database is tagged with style labels by users or other sources, including but not limited to "jazz", "classical", etc. One audio data should correspond to multiple style labels. The style labels of audio data are normalized to obtain a probability vector corresponding to each style of audio data, and this vector is characterized by methods including but not limited to: matrix decomposition, factor decomposer, word vectorization, etc. A deep neural network is trained using the time-frequency domain features of the music waveform as input and the style label feature vector as output. If the user prefers an audio data with no style label or an incomplete label, the audio waveform of this audio data will be mapped to a style label feature vector using the feature extraction method and the trained deep neural network. Based on the style label feature vector, a design that incorporates the existing parameters of the sound quality characteristics will be fed back to the user.

Figure 5:
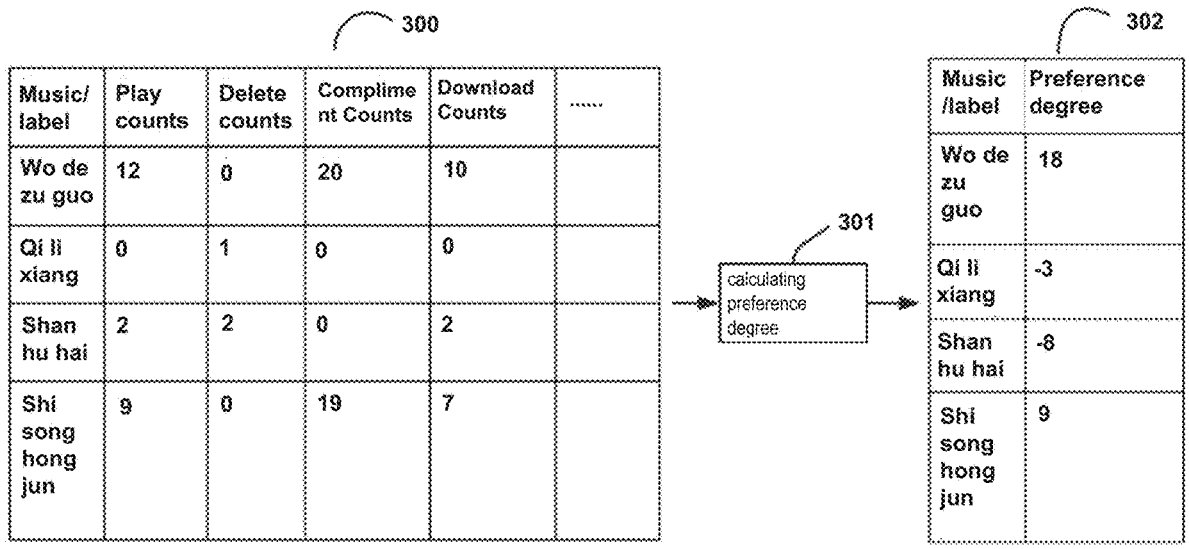
FIG. 5 is a schematic diagram of a design system for forming an online style fusion EQ equalizer according to the embodiments of the present invention.

Further, as shown in FIG. 5, the method of forming the online style fusion audio EQ design system comprises the following steps.

Extracting style label features (S12) and the data features of the music data based on the audio database.

Wherein the method of extracting the style label features includes but not limited to methods such as matrix decomposition, factor decomposer, word vector quantization, and the like. The data features of the audio data include but not limited to distinct features of the audio waveform. The methods for extracting the data features include but not limited to Fast Fourier Transformation (FFT), Mel-Frequency Cepstral Coefficient (MFCC), and the like.

Figure 6:
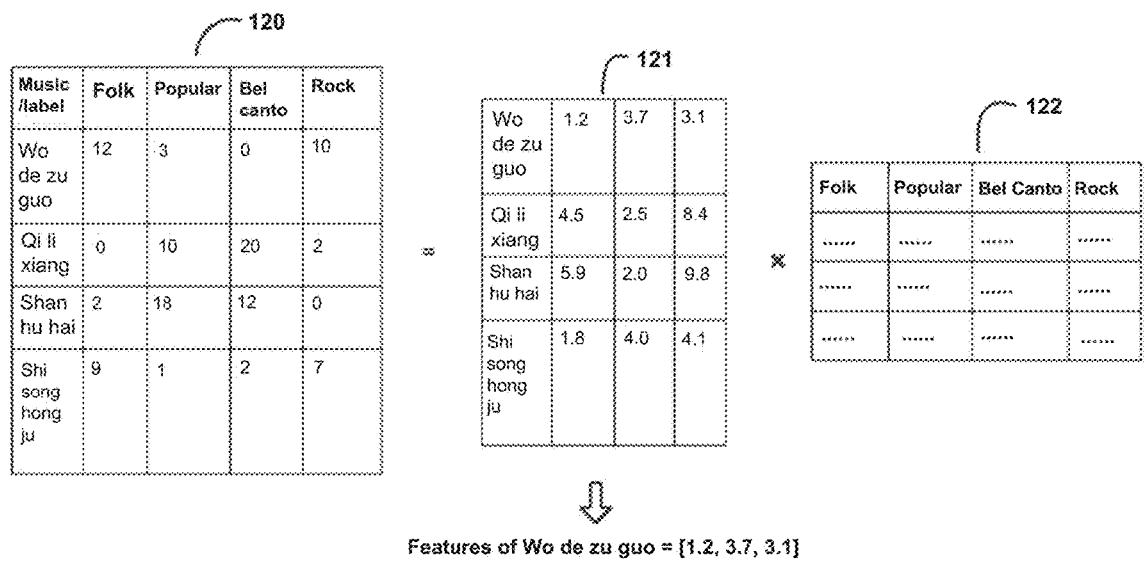
FIG. 6 is a schematic diagram of a process for extracting style label features of music data according to the embodiments of the present invention.

In an embodiment, a matrix decomposition is used to illustrate the process of extracting the style label features of music data. Referring to FIG. 6, users label the style labels (e.g., style labels) of different music to form a labeling matrix 120. The data in the labeling matrix 120 represent the number of times the music has been labeled. For example, if 12 users label the music "Wo de zu guo" as "Folk Music", the data in the line "Wo de zu guo" and row "Folk Music" of the labeling matrix 120 will be 12. Each row of the matrix 120 is labeled as a "style label" for a piece of music.

Each row of the original labeling matrix 120 is clearly a sparse vector. That is, it is normal for a music's style labels to have a few coordinates that are positive and others that are zero. It is very rare that all coordinates are positive. This means that most music should correspond to only a few styles, or even just one style. Therefore this labeling matrix 120 is very sparse. Style label feature extraction is needed so that the style features of each music are more dense and could better reflect the correlation of features between similar music.

The standard matrix 120 is decomposed, and the decomposition results are a style label feature matrix 121 and a weight matrix 122. Each row of the style label feature matrix 121 is a style label feature of a piece of music, which can be regarded as a compression of the sparse vector of style labels. Similar music has a high degree of similarity between the style label features, such as "Wo de zu guo" and "Shi song hong jun" feature cosine correlation is obviously higher than "Wo de zu guo" and "Qi li xiang". Each column of the weighting matrix 122 corresponds to a musical style, and the value of a column characterizes the weight of this musical style on each element of the style label feature matrix 121. The result of multiplying the style label feature matrix 121 and the weight matrix 122 is an approximate reduction of the original labeling matrix.

using the audio data features of the audio database as input layer data and using the style label features as output layer data to train to obtain the audio balancing model (S13).

Extracting features of user preference audio data to obtain preference data features, using the preference data features as input data of the audio balancing model to obtain style label features of the user preference audio data (S14).

In an embodiment, a user preferred piece of music is obtained, features are extracted from the music waveform and are used as input of a computation using a neural network model, the output of the computation is a vector of style features, i.e., style label features, for the piece of music. For different segments of a music, the outputs may be different. Methods to obtain a final style feature include, but are not limited to: taking an average of the output of each segment, or taking other form of fusing (e.g., voting) result. Each piece of music outputs a final vector of style features.

Reverting the style label features of the user preference audio data to style labels of the user preference audio data (21) to form a user preference style portrait based on the style labels of the audio data to be processed.

Figure 7:
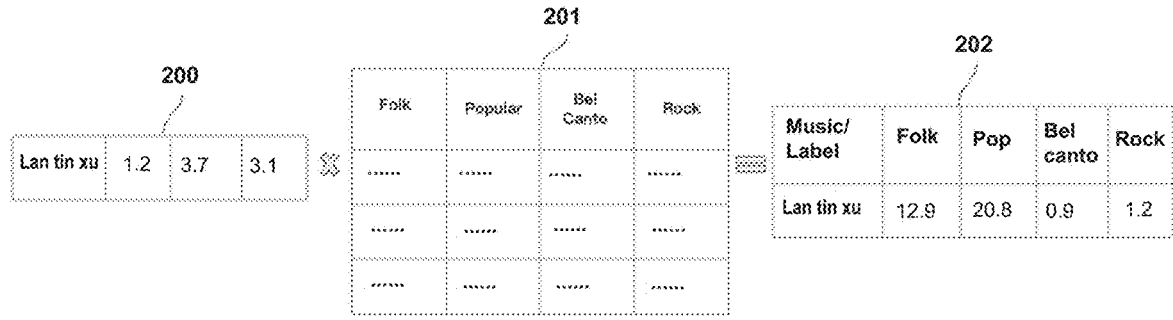
FIG. 7 is a schematic diagram of a process of reverting a style tag feature to a style tag of music data according to the embodiments of the present invention.

In an embodiment, a matrix decomposition is used as an example to illustrate the process of reverting the style tag features of the music data to style tags. Referring to FIG. 7, the feature vector output from the deep neural network model is the style label feature 200 of the music data, multiplied by the weight matrix 201 (i.e., the weight matrix 122 in the style label feature extraction), will revert the possible style labels 202 of the music data. It should be noted here that if other style label feature extraction methods, such as factor decomposers, are taken earlier, the method of reverting the style labels should correspond to the feature extraction method.

Figure 8:
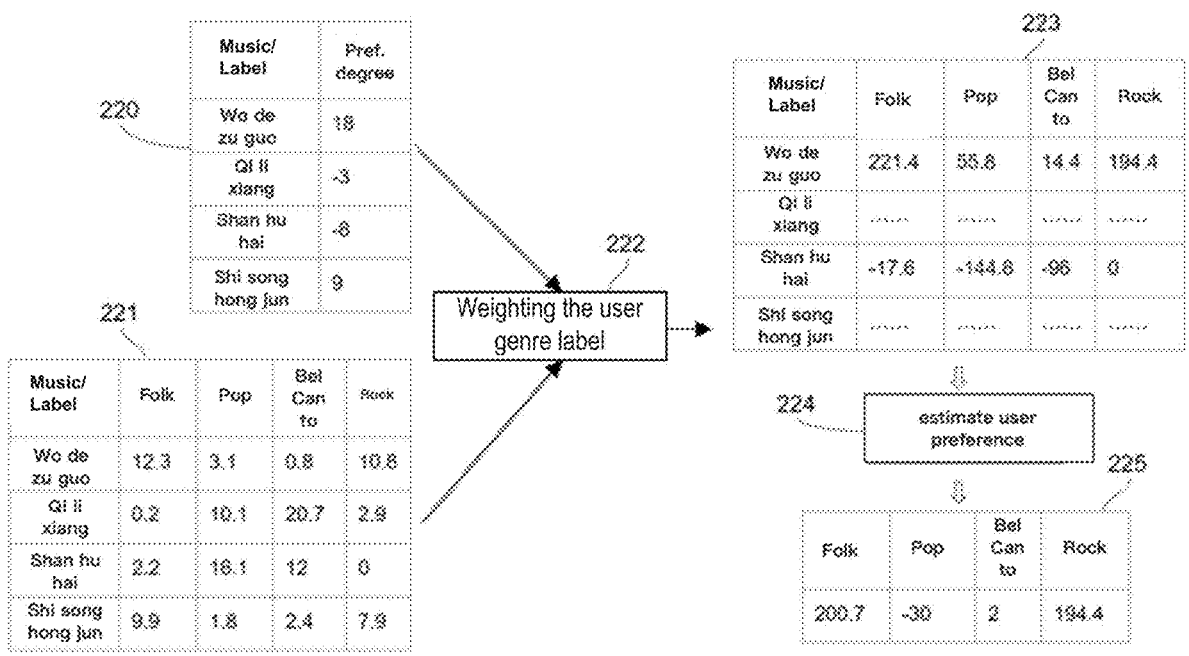
FIG. 8 is a schematic diagram of a process of forming a user preference style style portrait according to the embodiments of the present invention.

In an embodiment, a matrix decomposition is used as an example to illustrate the process of forming a user preference style portrait. Referring to FIG. 8, a matrix 220 of the user preference for each song is obtained based on the user preference music accumulator (S3), and a matrix 221 of style distribution for each song of the user is obtained based on the style labels (S21) of the user preference music data, and the user preference degree for each style can be calculated by multiplying the matrices 220 and 221. For example, the matrix 220 is recorded as A and is a M*1 matrix, wherein M is the number of music. Matrix 221 is recorded as B and is a M*N matrix, where N is the number of style. The user style labels are weighted based on matrices A and B. For example, multiplying the values of each row of matrix A by the values of each row of matrix B generates matrix 223, recorded as C, wherein C(i,j)=A(i)*B(i,j). Adding the columns of matrix C generates a user style preference matrix 225, recorded as P, wherein i, j, k, M, and N are natural numbers.

Figure 9:
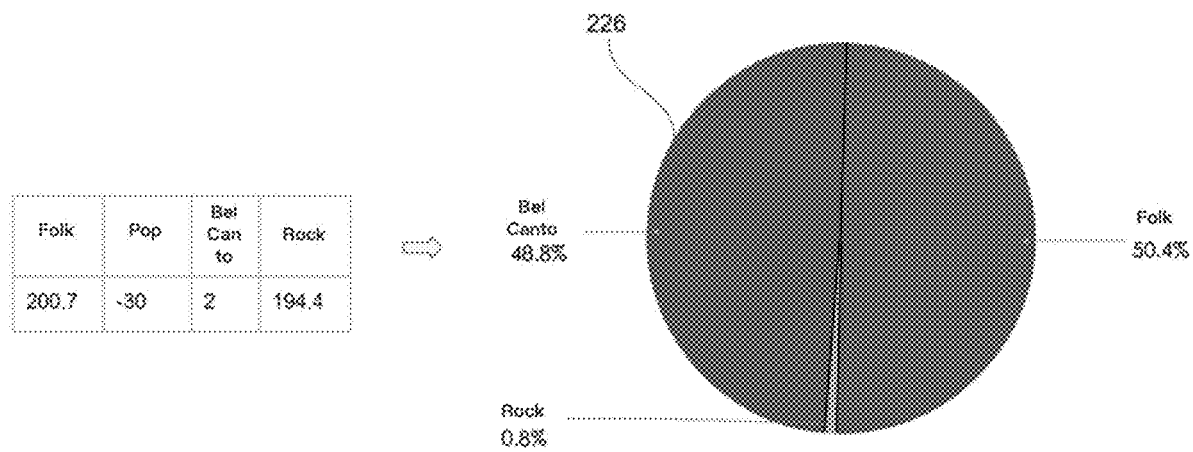
FIG. 9 is a schematic diagram of the user preference style portrait according to the embodiments of the present invention.
Figure 10:
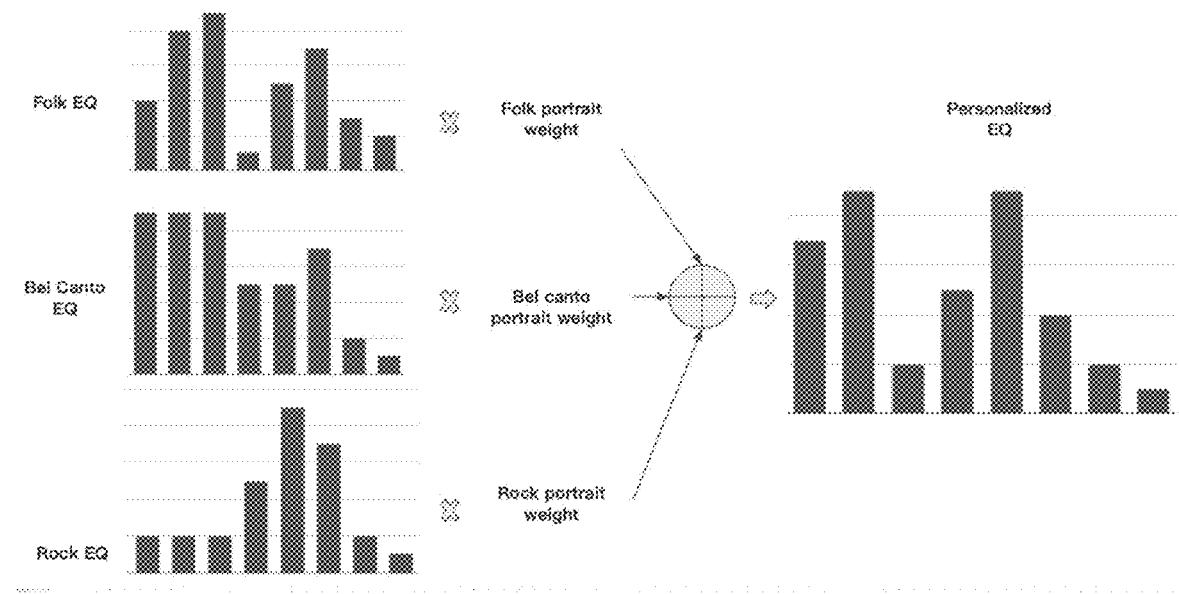
FIG. 10 is a schematic diagram of an online Equalizer (EQ) balance results according to the embodiments of the present invention.

A drawing of user preference categories, including and not limited to pie charts, is obtained based on the user style preference matrix 225, see FIG. 9, wherein categories with negative scores can be ignored.

Obtaining the online audio balancing results by fusing the user preference style portrait and audio balancing parameters of corresponding style (S23).

Wherein, the user preference style portrait reflects a user's preference for each style of audio data. The user preference style portrait includes but not limited to a graph (e.g., a bar graph, a pie chart) reflecting a proportion or weight of each style of audio data. In an embodiment, the music label features that the user frequently clicks on have maximum values on the coordinates of the "Rock" style, and the drawing may show that "Rock" is the user's primary preference, then the rock style has a larger percentage of the drawing. In an embodiment, see FIG. 10, EQ curves for each style are known, and weights of each style in the user preference style portrait are combined to obtain the online EQ equalization of the user, i.e., the personalized EQ.

The online EQ balance result of the user is sent to the user (S24).

Further, the off-line style fusion EQ equalizer design system learns EQ settings of a set of user preference music using an unsupervised deep learning method method. A number of uniformly selected styles of music preferred by users from an audio database are used as training samples, and each frame of frequency domain features is extracted as a visual layer to train a restricted Boltzmann machine (BRM). A weighted average of the output of the BRM for each music is used to invert the BRM and result a visual layer used as the "music average frequency domain features". When a user's music list accumulates to a certain size, select the music in the list with high user preference values and extract the frequency domain features of each frame as a visual layer to train a BRM. A weighted average of the output of the BRM for each music is used to invert the BRM and result a visual layer used as the "average frequency domain characteristics of the music preferred by the user".

Figure 11:
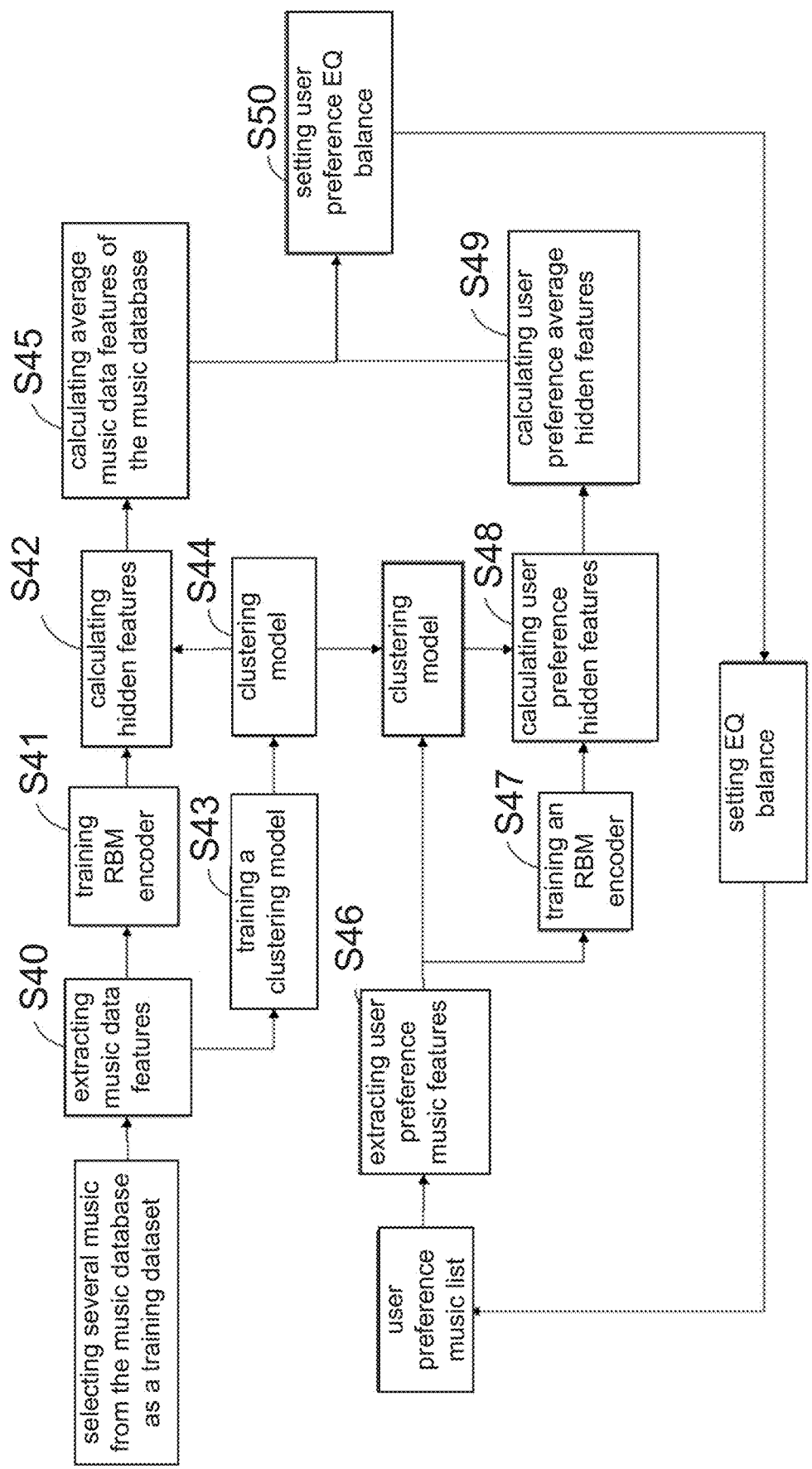
FIG. 11 is a schematic diagram of an offline EQ balance system according to the embodiments of the present invention.

As shown in FIG. 11, method of forming the offline style fusion EQ equalizer design system includes the following steps.

Using user preference audio of the audio database as a training dataset, performing feature extraction to obtain audio data features of the audio database (S40).

Wherein the audio data features include but not limited to time and/or frequency domain features (e.g., amplitude spectrum and/or phase information).

Training a RBM with the audio data features as visual layer inputs (S41).

Figure 12:
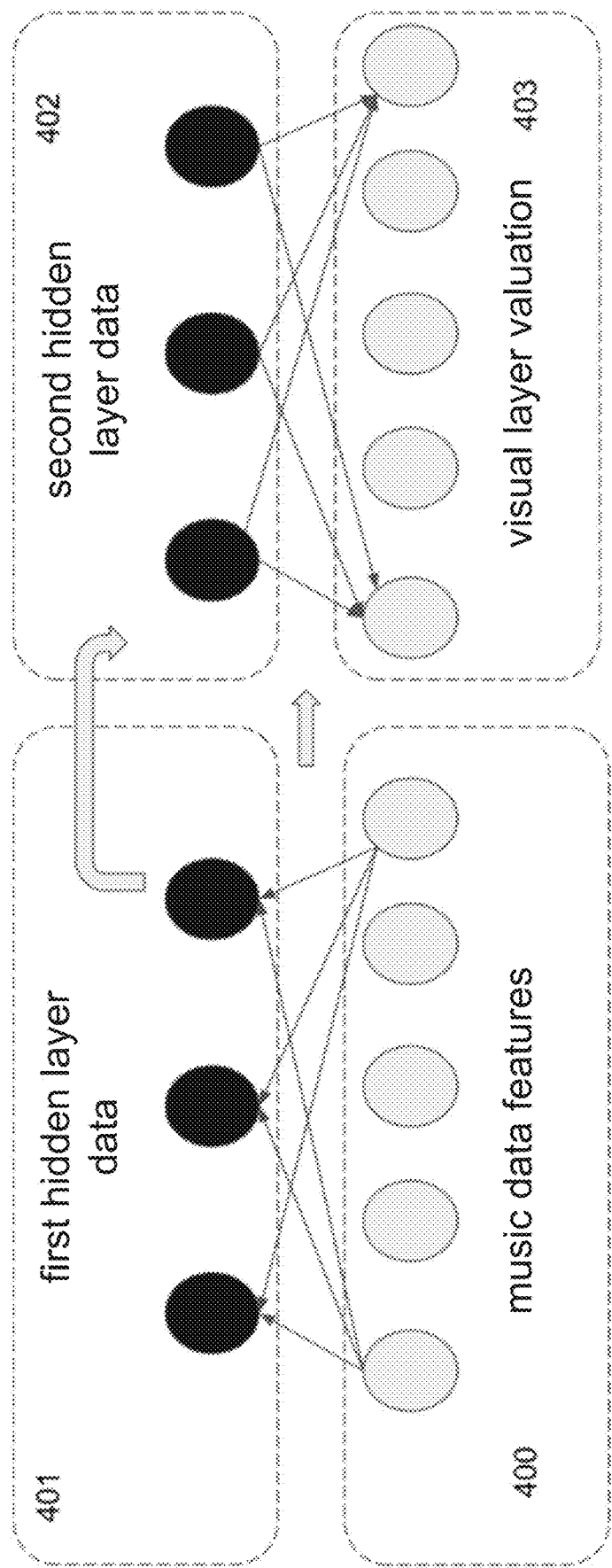
FIG. 12 is a schematic diagram of a restricted Boltzmann machine according to the embodiments of the present invention.

In an embodiment, see FIG. 12, using a music data feature 400, such as time-frequency domain features, as a visual layer input, and perform a neural network forward operation to obtain a first hidden layer data 401. RBM networks are two-way transmission networks. A second hidden layer data 402 performs a forward neural network operation in the opposite direction with the same connection weights to obtain a visual layer valuation 403. Generally, there is an error between a valuation 403 and the original input music data features 400. The network weights are adjusted according to this error until the error is less than an acceptable error for the training dataset.

Obtaining hidden layer features by inputting the audio data features of the training dataset into the visual layer of the RBM based on the trained RBM. Obtaining average hidden features (S42) by classifying the hidden layer features by inputting them into a clustering model that has been trained to generate average hidden layer features (S44).

Wherein the trained clustering model comprises: training to obtain a clustering device of class N (N is a natural number) with the high preference value music data features as input (S43).

The method of generating an average hidden layer features also comprises: weighting the hidden layer features according to the clustering results of the clustering model to form an average hidden layer feature.

In an embodiment, suppose there are M samples, then M hidden layer features will be output. The M hidden layer features are weighted and averaged according to the clustering results. For example, there are N classes, and the number of samples for each class is Q(k), wherein k=1, 2 . . . N. The weighted average of the clustering results yields a vector that can be viewed as the average of the hidden layer features of all styles of music (including and not limited to the feature spectrum of the audio database).

Obtaining an average audio data feature of the audio database by performing an inverse computation based on the average hidden layer features and the RBM (S45).

Wherein the average music data feature can be viewed as an average music data feature for all styles of music.

Training a user preference RBM (S47) by extracting features of audios in the user preference music list and using the extracted user preference audio data features as visual layer input (S46).

Wherein the method of training the user preference RBM is similar to the method of S41; the user preference music features include and are not limited to time domain and/or frequency domain features.

Obtain user preference hidden layer features by inputting the user preference music features into the RBM visual layer based on the trained user preference RBM. Generate user preference average hidden layer features by classifying the user preference hidden layer features using the clustering model (S48).

The clustering model is the clustering model trained in S43, and the user preference hidden layer features are input to count the distribute the class of the user music features. The method for generating the average hidden layer features of user preferences is similar to the method described in the preceding S42. The user preference hidden layer features are weighted and averaged according to the clustering results of the clustering model to obtain the user preference average hidden layer features.

Obtain user preference average audio data features by performing an inverse computation based on the user preference average hidden layer features and the user preference RBM (S49).

Obtain the audio balancing results based on the user preference average audio data features and average audio data features of the audio database (S50).

Wherein the EQ equalization setting for obtaining user preferences includes and is not limited to the EQ adjustment model. The EQ adjustment model computes the EQ equilibrium setting for user preferences by comparing the two features.

In an embodiment, the EQ regulation model is an EQ adjuster. The EQ adjuster as compares the average music features of the user preference music with the average music features of the audio database. Because the average music features of the music library reflect the universal characteristics that music has, the average music features of the user preference music reflects the characteristics of the user preference (for example, the region of the spectrum where the user preference profile significantly deviates from the audio database profile is the user preference fraction). The EQ adjuster enhances or attenuates the EQ curve according to this part of the deviation trend, and then outputs the final EQ curve, i.e., the user preference EQ equalization setting.

The above examples describe a deep learning method based audio balancing method according to embodiments of the present invention. The deep learning method based tone range balance method according to the present embodiments can be implemented in a device, apparatus, or system having a memory and processor.

In addition, the deep learning method-based tonal balance method according to the present embodiment may be easily deployed on a mobile device such as a smartphone, a tablet, a personal computer, a speaker, and the like. Alternatively, the deep learning method based audio balancing method according to the present embodiments can also be deployed on the server side (or cloud side). Alternatively, the deep learning method based audio balancing method according to the present embodiments can also be distributedly deployed at the server side (or cloud side) and at a personal terminal.

Figure 13:
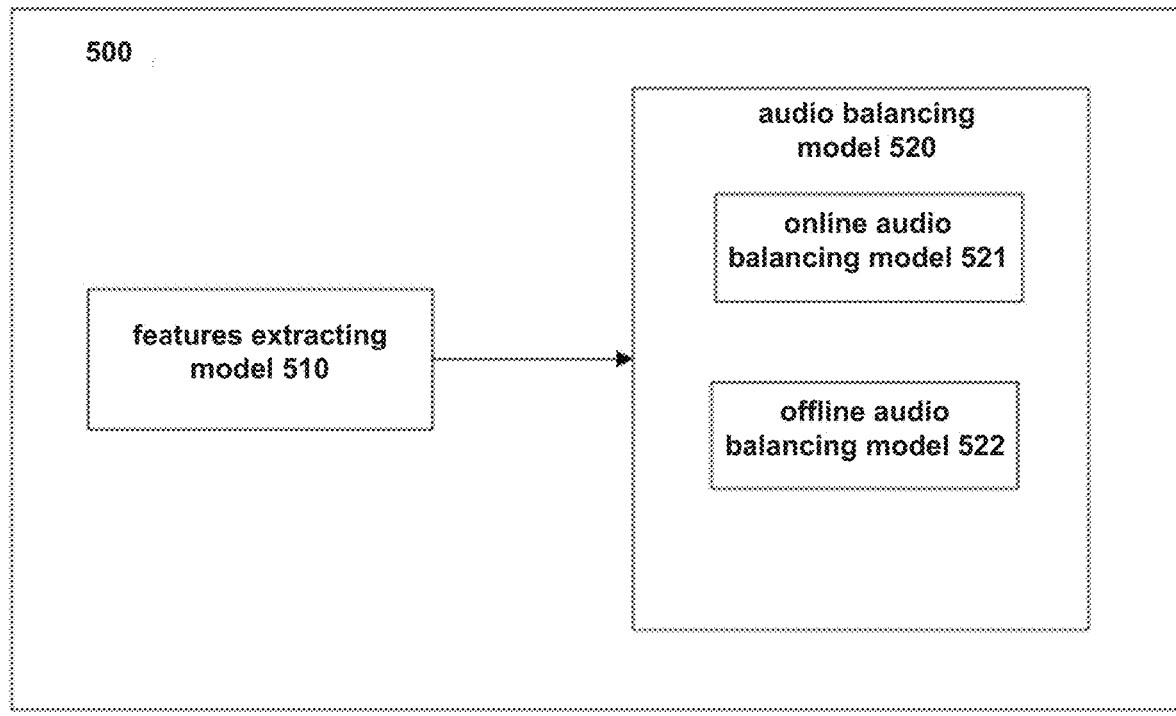
FIG. 13 is a schematic diagram of a deep learning method based audio balancing device according to the embodiments of the present invention.

According to another aspect of the present invention, a deep learning method based audio balancing apparatus is provided. Referring to FIG. 13, FIG. 13 illustrates a schematic diagram of a deep learning method based audio balancing apparatus 500 according to embodiments of the present invention.

The deep learning method based audio balancing apparatus 500 includes a feature extraction module 510 and an audio balancing module 520. Each module can perform various steps/functions of the deep learning method based audio balancing method respectively. Only the main functions of each module of the deep learning method based audio balancing apparatus 500 are described below, while omitting the details already described above.

The feature extraction module 510 is used to obtain data or user preference data in the audio database and perform feature extraction to obtain features of the data or user preference data in the audio database. The audio balancing module 520 is used to generate audio balancing results based on the features of the lossy audio data extracted by the feature extraction module, using the trained tonal balancing model. Both the feature extraction module 510 and the audio balancing module 520 can be implemented by the processor 102 in the electronic device shown in FIG. 1 running the program instructions stored in the memory 104.

The audio balancing module 520 further comprises an online audio balancing module 521 and/or an offline audio balancing module 522. The online audio balancing module 521 is configured to obtain an online audio balancing model by using a supervised deep learning method method to evaluate real time user preference music based on the audio database and the user preference music list, the online audio balancing module 521 is further configured to obtain an online audio balancing results by combining an music style equalizer. The offline audio balancing module 522 is configured to extract features of the user preference music based on the user preference music list and obtain an offline audio balancing model 522 using an unsupervised deep learning method method, the offline audio balancing module 522 is further configured to generate offline audio balancing results for the user.

Figure 14:
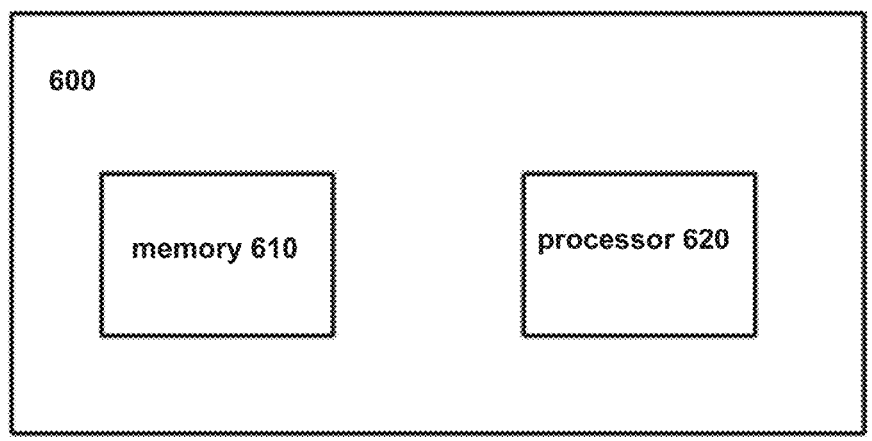
FIG. 14 is a schematic block diagram of a deep learning method based audio balancing system according to embodiments of the present invention.

According to another aspect of the present invention, a deep learning method based audio balancing system is provided. Referring to FIG. 14, FIG. 14 shows a schematic diagram of a deep learning method based audio balancing system 600 according to embodiments of the present invention.

The deep learning method based tone range balance system 600 includes a memory 610 and a processor 620. Wherein the memory 610 stores a program for implementing a corresponding step in the deep learning method based tone range balance method according to embodiments of the present invention. The processor 620 is used to run the program stored in the memory 610 to perform the corresponding step in the deep learning method based tone range balance method according to the present embodiment and to implement the corresponding module in the deep learning method based tone range balance device according to the present embodiments.

According to another aspect of the invention, a storage medium is also provided to store program instructions for performing corresponding steps of the deep learning method based tone range balance method of the present embodiments when the program instructions are run by a computer or processor, and for implementing corresponding modules in the deep learning method based audio balancing apparatus according to the present embodiments. The storage medium may include, for example, a memory card of a smart phone, a storage component of a tablet computer, a hard disk of a personal computer, a read-only memory (ROM), an erasable programmable read-only memory (EPROM), a portable compact disk read-only memory (CD-ROM), a USB memory, or any combination of the aforementioned storage mediums. The computer-readable storage medium may be any combination of one or more computer-readable storage mediums.

In an embodiment, the computer program instructions, when run by the computer, may implement the various functional modules of the deep learning method based tonal balance apparatus according to the embodiment of the present invention and/or may perform the deep learning method based tonal balance method according to the embodiment of the present invention.

The various modules of the deep learning method based tonal balance apparatus according to the present embodiment can be implemented by the processor of the electronic device for deep learning method based tonal balance according to the present embodiment running computer program instructions stored in the memory, or can be implemented when the computer instructions stored in the computer-readable storage medium of the computer program product according to the present embodiment are run by the computer.

In addition, according to the present embodiment, there is provided a computer program which may be stored on a cloud or local storage medium. The computer program is used to perform the corresponding steps of the deep learning method-based tone-balancing method of the present embodiments when it is run by a computer or processor, and is used to implement the corresponding module in the deep learning method based tonal balance apparatus according to the present embodiments.

In summary, The present invention is proposed to solve the above problems by providing a deep learning method based audio balancing method, apparatus, system and computer storage medium. The present invention employs deep neural networks and unsupervised deep learning method to solve the problems of audio balancing of unlabeled music and music of unknown style. The present invention also combines user preferences statistics to achieve a more rational multi-style audio balancing design to meet individual needs.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

One skilled in the art may realize that the various units and algorithmic steps described in the embodiments disclosed herein could be implemented by hardware or a combination of software and hardware. Whether these functions are performed in hardware or software depends on the particular application and design constraints of the technical solution. The skilled person may use different methods to implement the described functions for each particular application, but such implementation should not be considered beyond the scope of the present invention.

In the several embodiments provided in this application, it should be understood that the disclosed devices and methods may be implemented in other ways. For example, the device embodiments described above are merely illustrative. For example, the division of the units described is only a logical functional division, and the actual implementation may have a different division. For example, a plurality of units or components may be combined or may be integrated into another device, and some features may be ignored or not performed.

A lot of details are illustrated in the specification provided herein. However, it should be understood that the embodiments of the present invention can be practiced without such specific details. In some examples, the known methods, structures, and techniques are not shown in detail so as not to obscure the understanding of the present specification.

Similarly, it should be understood that in order to streamline the invention and aid in the understanding of one or more of the various inventive aspects, in the description of exemplary embodiments of the invention, the various features of the invention are sometimes grouped together into individual examples, figures, or descriptions thereof. However, the method of the invention should not be construed as reflecting an intent that the claimed protection of the invention requires more features than those expressly recited in each claim. More precisely, as reflected in the corresponding claims, the inventive point is that the corresponding technical problem can be solved with less than all of the features of a single disclosed embodiment. Claims that follow a specific embodiment are thus explicitly incorporated into that embodiment, with each claim itself serving as a separate embodiment of the invention.

Those skilled in the art will understand that all features disclosed in this specification (including the claims, summary and drawings) and all processes or units of any method or equipment so disclosed may be combined in any combination, except where the features are mutually exclusive. Unless otherwise expressly stated, each feature disclosed in this specification (including the claims, abstracts and drawings) may be replaced by an alternative feature that provides the same, equivalent or similar purpose.

Furthermore, those skilled in the art will appreciate that while some of the embodiments described herein include features included in other embodiments, the combination of features of different embodiments means that they are within the scope of the present invention and form different embodiments. For example, in the claims, any one of the embodiments claimed to be protected could be used in any combination.

The embodiments of the present invention can be implemented in hardware, or in software modules running on one or more processors, or in a combination thereof. Those skilled in the art should understand that a microprocessor or digital signal processor (DSP) could be used in practice to implement some or all of the functionality of some of the modules in an article analysis device according to the embodiments of the present invention. The invention can also be implemented as a program (e.g., a computer program and a computer program product) for a device that performs some or all of the methods described herein. Such a program implementing the invention may be stored on a computer readable medium, or may have the form of one or more signals. Such signals may be available for download from an Internet site, or may be provided on a carrier signal, or in any other form.

It should be noted that the above embodiments illustrate rather than limit the invention and that those skilled in the art may devise alternative embodiments without departing from the scope of the appended claims. In the claims, no reference symbol located between parentheses should be constructed as a limitation of the claims. The word "comprising" does not exclude the existence of components or steps not listed in the claims. The word "one" or "a" preceding an element does not preclude the existence of a plurality of such elements. The present invention may be realized with the aid of hardware comprising a number of different elements and with the aid of a suitably programmed computer. Among the unitary claims enumerating a number of devices, several of these devices may be embodied in a single hardware item. The use of the words first, second, and third, etc., does not indicate any order. The words may be interpreted as names.

The foregoing is merely an illustration of or a description of embodiments of the present invention. The scope of protection of the present invention is not limited thereto. Any person skilled in the art may readily conceive of variations or substitutions within the technical scope disclosed by the present invention, which shall be covered by the scope of the present invention. The scope of the present invention shall be the scope of the claims.

What is claimed is:

1. A method comprising:

extracting, by a computing device, audio data features from audio data;

extracting one or more features of music preferences of a user from a music preference list of the user;

determining, based on the audio data features and the one or more features of music preferences of the user, a trained audio equalization model, wherein the determining the trained audio equalization model comprises:

determining, based on user preference audio of an audio database, audio data features of user preference audio data;

training a restricted Boltzmann machine (RBM) model using the extracted audio data features of the user preference audio data as visual layer inputs;

determining hidden layer features based on inputting the extracted audio data features of the user preference audio data into a visual layer of the trained RBM model;

classifying the hidden layer features based on inputting the hidden layer features into a trained clustering mode;

determining, based on the classified hidden layer features, average hidden layer features;

performing, based on the average hidden layer features and the RBM model, an inverse computation;

determining, based on the inverse computation, an average audio data feature of the audio database; and training a user preference RBM model based on extracting audio features from the music preference list of the user and using the extracted audio features from the music preference list of the user as visual layer input for the trained RBM model; and generating, based on the trained audio equalization model, an audio equalization result.

2. The method of claim 1, wherein the determining the trained audio equalization model comprises:
 determining, based on a supervised deep learning method associated with the audio database and the music preference list of the user, one or more styles of user preference music; or
 analyzing, based on an unsupervised deep learning method, the one or more features of music preferences of the user.

3. The method of claim 1, wherein the determining the trained audio equalization model comprises:
 extracting, based on the audio database, one or more music style label features and the audio data features;
 designating the audio data features as input layer data and the one or more music style label features as output layer data; and
 training, based on the input layer data and the output layer data, an audio equalization model.

4. The method of claim 1, wherein the extracting the audio data features comprises performing feature extraction after framing the audio data.

5. The method of claim 1, wherein the audio data features comprise one or more of time domain features or frequency domain features.

6. The method of claim 1, wherein the trained audio equalization model comprises one or more of an online audio equalization model, or an offline audio equalization model.

7. The method of claim 1, wherein the generating the audio equalization result comprises:
 extracting preference data features from the user preference audio data;
 determining, based on the preference data features and the trained audio equalization model, style label features of the user preference audio data;
 reverting the style label features of the user preference audio data to style labels of the user preference audio data;
 determining, based on the style labels of the user preference audio data, a user preference style portrait; and
 determining, based on the user preference style portrait and audio equalization parameters of a corresponding style, the audio equalization result.

8. The method of claim 7, wherein the user preference style portrait comprises information indicating a user preference level for each style of audio data.

9. The method of claim 1, wherein the generating the audio equalization result comprises:
 determining user preference hidden layer features based on inputting the extracted features from the music preference list of the user into a visual layer of the trained user preference RBM model;
 generating user preference average hidden layer features based on classifying the user preference hidden layer features using the trained clustering model;
 determining user preference average audio data features based on performing an inverse computation on the user preference average hidden layer features and the trained user preference RBM model; and
 determining, based on the user preference average audio data features and the average audio data features of the audio database, the audio equalization result.

10. The method of claim 9, wherein the generating the audio equalization result further comprises:

comparing the user preference average audio data features with the average audio data features of the audio database; and
enhancing or attenuating audio equalization based on a deviation trend indicated by the comparison.

11. An apparatus comprising:
one or more processors; and
memory storing instructions that, when executed by the one or more processors, cause the apparatus to:
 extract audio data features from audio data;
 extract one or more features of music preferences of a user from a music preference list of the user;
 determine, based on the audio data features and one or more features of music preferences of the user, a trained audio equalization model, wherein determining the trained audio equalization model comprises:
  determining, based on user preference audio of an audio database, audio data features of user preference audio data;
  training a restricted Boltzmann machine (RBM) model using the extracted audio data features of the user preference audio data as visual layer inputs;
  determining hidden layer features based on inputting the extracted audio data features of the user preference audio data into a visual layer of the trained RBM model;
  classifying the hidden layer features based on inputting the hidden layer features into a trained clustering mode;
  determining, based on the classified hidden layer features, average hidden layer features;
  performing, based on the average hidden layer features and the RBM model, an inverse computation;
  determining, based on the inverse computation, an average audio data feature of the audio database; and
  training a user preference RBM model based on extracting audio features from the music preference list of the user and using the extracted audio features from the music preference list of the user as visual layer input for the trained RBM model; and
 generate, based on the trained audio equalization model, an audio balancing result.

12. The apparatus of claim 11, wherein the instructions, when executed by the one or more processors, further cause the apparatus to:
 determine, based on a supervised deep learning method associated with the audio database and the music preference list of the user, one or more styles of user preference music; or
 analyze, based on an unsupervised deep learning method, the one or more features of music preferences of the user.

13. The apparatus of claim 11, wherein the instructions, when executed by the one or more processors, further cause the apparatus to:
 extract, based on the audio database, one or more music style label features and the audio data features;
 designate the audio data features of the audio database as input layer data and the one or more music style label features as output layer data; and
 train, based on the input layer data and the output layer data, an audio equalization model.

14. The apparatus of claim 11, wherein the instructions, when executed by the one or more processors, further cause the apparatus to:
- extract preference data features from the user preference audio data;
- determine, based on the preference data features and the trained audio equalization model, style label features of the user preference audio data;
- revert the style label features of the user preference audio data to style labels of the user preference audio data;
- determine, based on the style labels of the user preference audio data, a user preference style portrait; and
- determine, based on the user preference style portrait and audio equalization parameters of a corresponding style, the audio equalization result.

15. The apparatus of claim 14, wherein the user preference style portrait comprises information indicating a user preference level for each style of audio data.

16. A non-transitory computer-readable medium storing instructions that, when executed by one or more processors, cause the one or more processors to perform:
- extracting audio data features from audio data;
- extracting one or more features of music preferences of a user from a music preference list of the user;
- determining, based on the audio data features and the one or more features of music preferences of the user, a trained audio equalization model, wherein the determining the trained audio equalization model comprises:
  - determining, based on user preference audio of an audio database, audio data features of user preference audio data;
  - training a restricted Boltzmann machine (RBM) model using the extracted audio data features of the user preference audio data as visual layer inputs;
  - determining hidden layer features based on inputting the extracted audio data features of the user preference audio data into a visual layer of the trained RBM model;
  - classifying the hidden layer features based on inputting the hidden layer features into a trained clustering mode;
  - determining, based on the classified hidden layer features, average hidden layer features;
  - performing, based on the average hidden layer features and the RBM model, an inverse computation;
  - determining, based on the inverse computation, an average audio data feature of the audio database; and
  - training a user preference RBM model based on extracting audio features from the music preference list of the user and using the extracted audio features from the music preference list of the user as visual layer input for the trained RBM model; and
- generating, based on the trained audio equalization model, an audio equalization result.

17. The non-transitory computer-readable medium of claim 16, wherein the instructions, when executed by the one or more processors, further cause the one or more processors to perform:
- determining, based on a supervised deep learning method associated with the audio database and the music preference list of the user, one or more styles of user preference music; or
- analyzing, based on an unsupervised deep learning method, the one or more features of music preferences of the user.

18. The non-transitory computer-readable medium of claim 16, wherein the instructions, when executed by the one or more processors, further cause the one or more processors to perform:
- extracting, based on the audio database, one or more music style label features and the audio data features;
- designating the audio data features of the audio database as input layer data and the one or more music style label features as output layer data; and
- training, based on the input layer data and the output layer data, an audio equalization model.

19. The non-transitory computer-readable medium of claim 16, wherein the instructions, when executed by the one or more processors, further cause the one or more processors to perform:
- extracting preference data features from the user preference audio data;
- determining, based on the preference data features and the trained audio equalization model, style label features of the user preference audio data;
- reverting the style label features of the user preference audio data to style labels of the user preference audio data;
- determining, based on the style labels of the user preference audio data, a user preference style portrait; and
- determining, based on the user preference style portrait and audio equalization parameters of a corresponding style, the audio equalization result.

* * * * *